United States Patent [19]

Guzik et al.

[11] 4,387,950

[45] Jun. 14, 1983

[54] SOCKET ASSEMBLY FOR ACCOMMODATING HORIZONTAL INSERTED COMPONENTS

[75] Inventors: Andrzej T. Guzik, Ft. Lauderdale; Lynn T. Gill, Coral Springs, both of Fla.

[73] Assignee: Motorola, Inc., Schaumburg, Ill.

[21] Appl. No.: 233,224

[22] Filed: Feb. 10, 1981

[51] Int. Cl.³ .................... H01R 13/11; H01R 23/02; H01R 25/02

[52] U.S. Cl. ............................ 339/136 M; 339/17 C; 339/192 R

[58] Field of Search .............. 339/17 R, 17 C, 17 LC, 339/17 D, 17 CF, 185 R, 185 RL, 191 R, 191 M, 191 S, 191 A, 192 R, 192 RL, 192 T, 176 M, 136 R, 136 M

[56] References Cited

U.S. PATENT DOCUMENTS

| | | | |
|---|---|---|---|
| 2,938,187 | 5/1960 | Brodrick et al. | 339/31 M |
| 3,697,933 | 10/1972 | Black et al. | 339/192 R |
| 3,772,635 | 11/1973 | Frey et al. | 339/99 R |
| 3,874,759 | 4/1975 | Colombo | 339/17 CF |
| 3,876,274 | 8/1975 | Buehlemann et al. | 339/17 LC |
| 4,003,617 | 1/1977 | Witek, Jr. et al. | 339/17 C |
| 4,165,147 | 8/1979 | Buck | 339/182 R |

Primary Examiner—Neil Abrams

Attorney, Agent, or Firm—Donald B. Southard; Edward M. Roney; James W. Gillman

[57] ABSTRACT

An improved socket assembly is disclosed which is especially suited for use in printed circuitry with dense configuration of components in limited areas of surface. The socket is mounted on an associated printed circuit board and allows horizontal insertion of vertically stacked keyed components, from either side of the socket assembly. The socket assembly further includes a non-metallic insert, consisting of two mating halves containing a plurality of wire contacts of equal geometric diameters, capable of accommodating component leads of differing geometric configurations (i.e., square, rectangular, triangular, round, etc.) which provide pressure to the component lead thereby holding the component in place. The insert is unaffected by the molten solder or flux used during the manufacturing process and prevents entry of contaminating material into the interior of the socket assembly during the soldering process thereby eliminating electrical shorting problems occasionally caused by the soldering process. The insert is surrounded by a U-shaped bracket which acts as a retainer spring on the insert to the socket assembly and is held in place by protrusions extending from the insert which mate with slots in the U-shaped bracket. The socket assembly is inserted into the printed circuit board and is removable from such printed circuit board prior to the soldering process.

6 Claims, 5 Drawing Figures

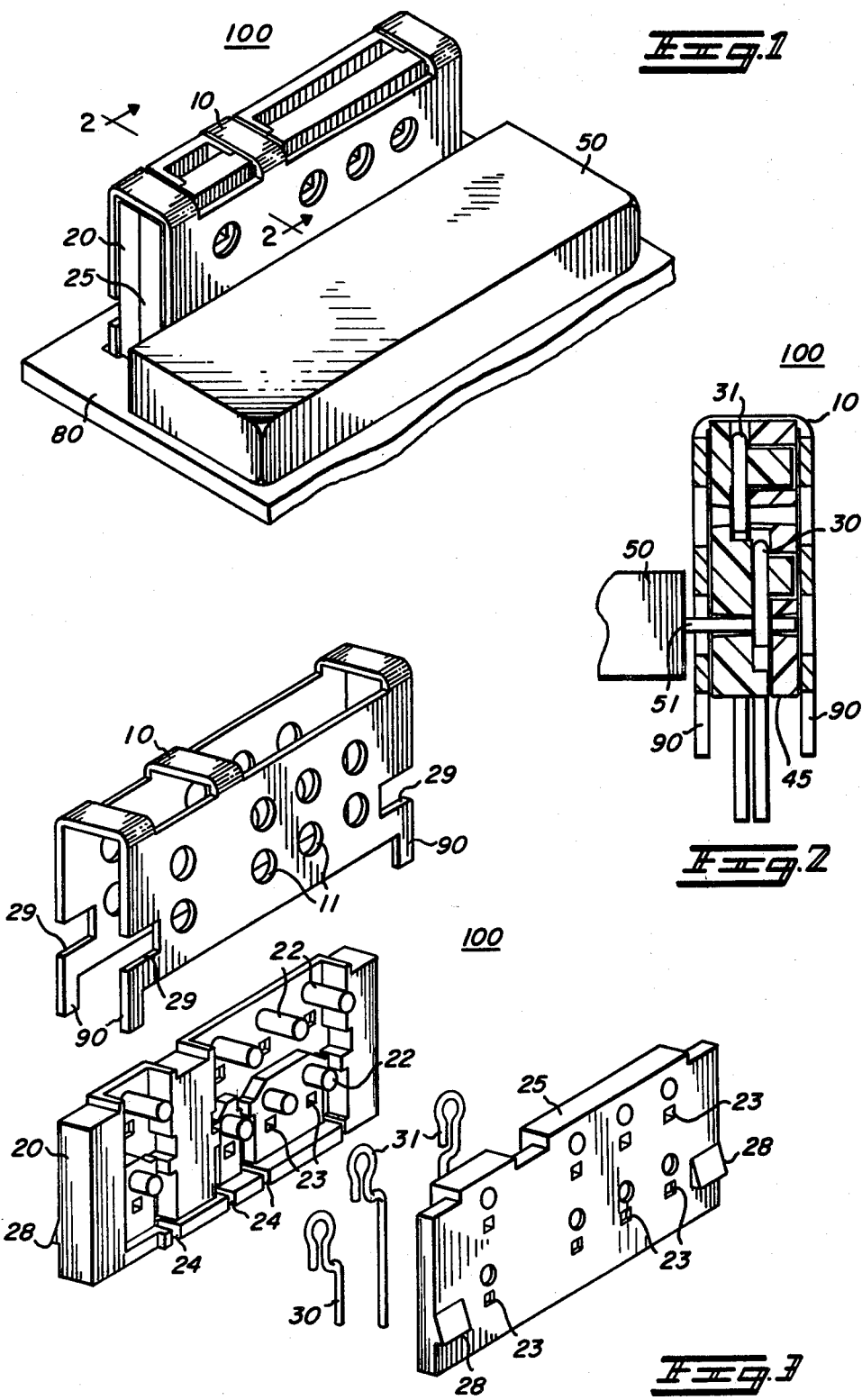

SOCKET ASSEMBLY FOR ACCOMMODATING HORIZONTAL INSERTED COMPONENTS

BACKGROUND OF THE INVENTION

The present invention relates generally to connector arrangements for accommodating a plurality of keyed components, and in particular to such a connector assembly wherein the associated components may be inserted horizontally from either side of the socket assembly in a vertically stacked relationship to each other.

There are many instances of components to be inserted into a printed circuit board where the density of electrical components makes available space a premium. This may have required a socket which facilitates keyed insertion of vertically stacked components inserted from a horizontal position. Several miniature socket arrangements, often used on printed circuit boards along with other circuit connections and components, are known in the art, including various component sockets allowing unkeyed insertion of a single component device and only in a single side of the socket, rather than accommodating insertion of multiple components in a vertically stacked fashion. Generally, the electrical contacts which are contained in such sockets, and to which are mated with the component leads, are made of sheet metal with no provision in the socket assembly housing to protect the electrical contacts from damage during component insertion. One such known socket assembly attempts to simplify circuit board layout and circuit board reliability, but contains sheet metal contacts and only accepts a single unkeyed electrical component. With sockets of this type, the electrical component must be inserted into the socket assembly, with the socket assembly itself inserted into the printed circuit board. However, after the soldering process, which usually consists of soldering by dipping the board below the surface of molten solder as in a conventional flow solder process, the electrical component may not be able to be removed. The problem is that if the inside socket assembly leads are soldered to the circuit board prior to insertion of the electrical component, the electrical component cannot be later inserted because solder will wick up into the contact area within the socket assembly, and prevent the component lead from mating with the sheet metal contact.

Other prior art devices involve socket assemblies which contain sheet metal contacts which require insertion into the base of the socket assembly to insure proper alignment in retention within the socket assembly apparatus. Additionally, often times the socket design will require a specific shaped pin on the mating electrical component which is to be inserted in order to insure proper contact. Component leads of other geometrical dimensions will not properly fit within the socket assembly.

Another disadvantage of still other socket assemblies which utilize sheet metal contacts and allow the insertion of multiple unkeyed electrical components into the socket assembly, is that often times an insulator of some material is required in the socket assembly to prevent the electrical component leads from shorting the other electrical contacts contained within the socket assembly.

A common disadvantage relating to all of the foregoing known prior art devices involves the relatively high cost, complexity and quantity of unique piece parts which comprise the socket assembly apparatus.

SUMMARY OF THE INVENTION

It is therefore an object of this invention to provide an improved small socket assembly to be used on an insulating base which is to be wave soldered and which overcomes the foregoing deficiencies.

Another object of the invention is to provide an improved socket assembly which will accommodate horizontal insertion of multiple keyed components vertically stacked from either side of said socket assembly.

Still another object of the invention is to provide an improved socket assembly wherein damage is prevented to the wire contacts contained within the socket assembly from over deflection during insertion of the component leads.

Yet another object of the present invention is to provide an improved socket assembly which prevents socket contamination and electrical shorting of internal contacts caused by solder migration during the wave-soldering process.

It is still another object of this invention to provide an improved socket assembly which contains wire contacts of the same geometry which will accept an electrical component lead with different cross-sectional geometries comprising round, square, triangular, etc. rather than sheet metal contacts or contacts of other configurations within a socket assembly.

It is yet another object of the invention to provide a small socket assembly which is of low cost and can be readily and easily manufactured.

In practicing the invention, an improved connector socket assembly is provided for accommodating a plurality of keyed, vertically stacked components which may be horizontally inserted from either side of the socket assembly. The socket assembly includes a plastic housing of interfitting connector halves wherein one of the housing halves has at least one cavity in the interior thereof, and wherein a plurality of laterally extending boss members are arranged in first and second horizontal rows in a desired key arrangement. The plastic housing further includes first and second rows of apertures extending through both housing halves and which are aligned and associated with each of the boss members. A plurality of preformed wire contacts are positioned about a respective boss member in the interior of the socket assembly which wire contacts include parallel portions extending across an associated aperture, with a further portion of the wire contact extending beyond the bottom edge of the housing member for mating with appropriate mounting means on an associated printed circuit board. The socket assembly also has a "U" shaped resilient bracket slidably overfitting the plastic housing for the securing of the housing halves together as an integral unit. The bracket itself includes appropriate apertures on respective sides thereof coinciding with the referenced housing apertures. The apertures are patterned to accept only components with certain predetermined, keyed lead configurations, but from either side of the socket assembly.

BRIEF DESCRIPTION OF THE DRAWINGS

The features of the present invention which are believed to be novel are set forth with particularity in the claims. The invention itself, however, together with further objects and advantages thereof, may be best understood by reference to the following description when taken in conjunction with the accompanying drawings, in which like reference numerals refer to like elements in the several figures, and in which:

FIG. 1 is a view in prespective of a socket assembly inserted on a printed circuit board and having an electrical component inserted into the socket assembly, which socket assembly has been constructed in accordance with the present invention.

FIG. 2 is an enlarged partial sectional view of a portion of the socket assembly of FIG. 1 taken essentially along lines 2—2 of FIG. 1.

FIG. 3 is an exploded view of the socket assembly of FIG. 1.

DETAILED DESCRIPTION OF THE PREFERRED EMBODIMENT

Figure 4:
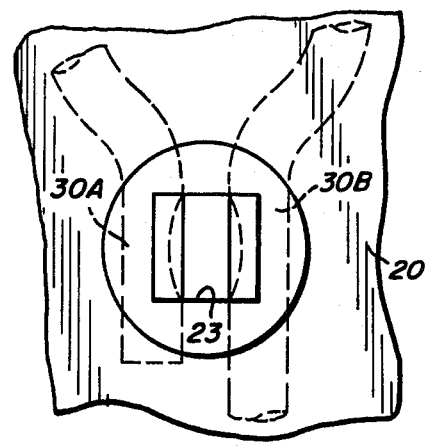
FIG. 4 represents an enlarged fragmentary side view showing an aperture for accepting a component lead.

Referring now to the drawings, FIG. 1 shows a perspective view of an electrical socket assembly 100 together with an associated electrical component 50 mounted on a circuit board 90, which socket assembly has been constructed in accordance with the present invention. The improved socket assembly 100 consists of a male interlocking integral plastic half 20 and a female complementary interlocking plastic half 25. The improved socket assembly is unified by a metal sleeve 10 which snaps over four protrusions 28 extending from the interlocking integral plastic halves 20 and 25 and fits into one of four slots 29 contained in the external metal sleeve 10 (best seen in FIG. 3). The socket assembly 100 has an anchor 90 on each of its end points. These anchors 90 enable the socket assembly 100 to be inserted into the circuit board 80 and held in place as the insulating base is wave soldered.

A plurality of wire contacts 30 and 31 are included which positively rest over internal bosses 22. Contacts 30 and 31 further include a portion which protrudes through the bottom of the socket assembly (best seen in FIG. 2) for insertion into the printed circuit board or other base. FIG. 2 further shows component 50 with its electrical lead 51 horizontally inserted into the socket assembly 100 making internal contact with a single wire contact 30. The male interlocking integral plastic half 20 and the female interlocking plastic half 25 form a tight fitting socket housing around the wire contacts 30 and 31 and prevent solder migration up into the socket assembly by forming a solid base at the bottom 45.

In FIG. 3 the entire socket assembly 100 is shown in an exploded view for clarity. As shown, the interlocking half 20 contains a plurality of protruding boss members 22 over which the associated wire contacts 30 and 31 are selectively positioned. As mentioned previously, a portion of these contacts extends downwardly through slots 24 beyond the lower edge of socket assembly 100. A metal U-shaped sleeve or bracket 10 is slidably overfitted the male and female halves 20 and 25 such that the exterior protrusions 28 fit snuggly in its corresponding slot 29 in the metal sleeve 10. Sleeve 10 further contains a plurality of keyed holes 11 which correspondingly align with an exact number of keyed square holes 23 contained within each of the interlocking integral male 20 and female 25 integral halves.

An enlarged side view of one of the apertures 23 in the socket assembly 100 is shown in FIG. 4. As shown, parallel extending portions 30a and 30b of an associated contact 30 (see FIG. 5) extend past the aperture 23. A part (shown in solid line) of each of the wire contact portions 30a and 30b extend into the aperture 23 and are intended to be contacted by an inserted lead of an electrical component (as depicted in FIG. 2). The wire contact portions 30a and 30b deflect upon receiving a component lead (shown in dotted line within aperture 23) to a maximum deflection allowed for by the rectangular shaped area of aperture 23.

Figure 5:
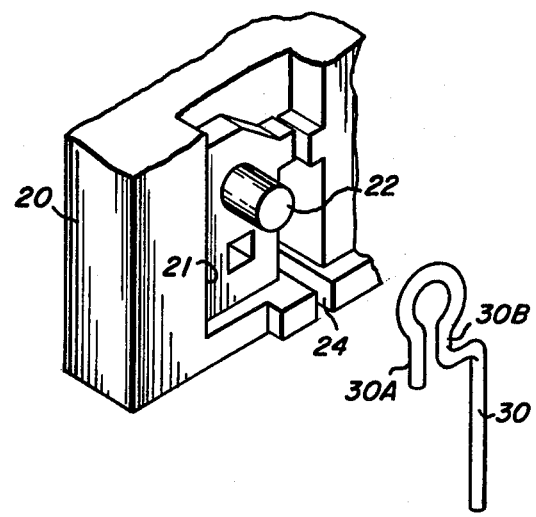
FIG. 5 is an enlarged fragmentary view of a portion of the housing illustrating a detail of mounting a wire contact.

In FIG. 5 an enlarged cutaway view is shown to better illustrate the mounting of an associated wire contact 30 in a housing cavity 21 of housing 20. As mentioned previously, a protruding boss 22 is contained within cavity 21 over which an associated wire contact 30 is snuggly and securely positioned, the bottom half of said wire contact 30 fitting in slot 24 and extending downwardly past the bottom of the socket assembly 100 for insertion into the respective keyed apertures of a base or printed circuit board (not shown) prior to the soldering process.

It can be seen from FIG. 1 that the improved socket assembly will permit the horizontal insertion of multiple keyed components (a single keyed component is illustrated) in a vertically-stacked manner; and FIG. 3 illustrates that the improved socket assembly will accept horizontal insertion of keyed component leads, into corresponding internal apertures in a desired keyed pattern corresponding to the keyed component leads, from either side of the socket assembly.

The enlarged side view of FIG. 4 of a single aperture 23 contained within the socket assembly, will accommodate the insertion of any component lead configuration (round, square, triangular, etc.), provided the diameter of such component lead is equal to or less than the dimension of the illustrated aperture 23.

Thus, there has been provided according to the invention, an improved, simple, and inexpensive small socket assembly allowing the horizontal insertion of keyed electrical components in a vertical stacked fashion. Although the foregoing has been a description and illustration of specific embodiments of the invention, various modifications and changes thereto can be made by persons skilled in the art within the scope and spirit of the invention as defined by the following claims.

We claim:

1. An improved connector socket assembly for accommodating a plurality of keyed, vertically stacked components which may be horizontally inserted from either side of the socket assembly, including in combination:

a plastic housing of interfitting connector halves wherein one of said housing halves includes at least one cavity in the interior thereof and further wherein a plurality of laterally extending boss members are arranged in first and second horizontal rows in a desired keyed arrangement;

said plastic housing further having first and second rows of apertures located to receive leads of said components extending through both housing halves and which are aligned and associated with each said boss members;

a plurality of performed wire contacts each positioned about a respective boss member and having parallel portions extending across an associated aperture, each of said wire contents having a further portion extending beyond the bottom edge of said housing member; and a U-shaped resilent bracket for slidably overfitting said plastic housing for the securing of said housing halves together, said bracket having apertures on respective sides thereof coinciding with said housing apertures.

2. An improved socket assembly in accordance with claim 1, wherein said interfitting secured housing halves form a tight seal against the bottom portion of the protruding wire contacts, thereby preventing solder migration or wicking into the improved socket assembly interior.

3. An improved socket assembly in accordance with claim 1, wherein said interfitting housing halves with protruding bosses and respective cavities allow for a positive alignment when the wire contact is positively located and maintained in the appropriate internal cavity, thereby negating the need for any special insulation members required for electrical isolation or special installation procedures.

4. An improved socket assembly in accordance with claim 1, wherein the U-shaped embracing bracket formed to retain and secure said housing halves has a plurality of solder lugs protruding from each bottom corner of said U-shaped bracket, thereby providing rigid mounting to an associated base.

5. An improved socket assembly in accordance with claim 1, wherein the U-shaped embracing bracket is formed to retain and secure said integral housing halves by interlocking in a snap fit over a plurality of external protrusions extending from each housing half.

6. An improved socket assembly in accordance with claim 1, wherein said plurality of wire contacts is the same size and geometry, held in a fixed position, said wire contacts deflecting when pressure is encountered by the horizontal insertion of a keyed component lead.

* * * * *

UNITED STATES PATENT AND TRADEMARK OFFICE
CERTIFICATE OF CORRECTION

PATENT NO. : 4,387,950

DATED : June 14, 1983

INVENTOR(S) : ANDRZEJ T. GUZIK

It is certified that error appears in the above—identified patent and that said Letters Patent is hereby corrected as shown below:

Column 4, line 66, "contents" should be -- contacts --.

Signed and Sealed this

Fourth Day of October 1983

[SEAL]

Attest:

GERALD J. MOSSINGHOFF

Attesting Officer

Commissioner of Patents and Trademarks